United States Patent
Hwang et al.

(10) Patent No.: US 7,194,723 B1
(45) Date of Patent: Mar. 20, 2007

(54) TECHNIQUES FOR MAPPING FUNCTIONS TO LOOKUP TABLES ON PROGRAMMABLE CIRCUITS

(75) Inventors: Yean-Yow Hwang, Palo Alto, CA (US); Richard Yuan, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 140 days.

(21) Appl. No.: 10/694,919

(22) Filed: Oct. 27, 2003

(51) Int. Cl.
*G06F 17/50* (2006.01)

(52) U.S. Cl. ................... 716/17; 716/1; 716/2
(58) Field of Classification Search ............ 716/16, 716/1, 2, 12, 17
See application file for complete search history.

(56) References Cited

U.S. PATENT DOCUMENTS

| | | | | |
|---|---|---|---|---|
| 5,521,835 A | * | 5/1996 | Trimberger | 716/17 |
| 6,360,352 B2 | * | 3/2002 | Wallace | 716/2 |
| 6,480,023 B1 | * | 11/2002 | Kaviani | 326/38 |
| 6,603,332 B2 | * | 8/2003 | Kaviani et al. | 326/39 |
| 2004/0133869 A1 | * | 7/2004 | Sharma | 716/16 |
| 2004/0155676 A1 | * | 8/2004 | Kaptanoglu et al. | 326/38 |

OTHER PUBLICATIONS

Valeria Bertacco & Maurizio Damiani, "The Disjunctive Decomposition of Logic Functions", ICCD97, Nov. 1997, pp. 78-82, IEEE Computer Society, Los Alamitos, CA, USA.□□*

Robert J. Francis, "A Tutorial on Logic Synthesis for Lookup-Table Based FPGAs", pp. 40-47, 1992 IEEE.*

Robert J. Francis et al., "Technology Mapping of Lookup Table-Based FPGAs for performance", pp. 568-571, 1991 IEEE.*

Vemuri et al., "BDD-Based Logic Synthesis for LUT-Based FPGAs", ACM Transactions on Design Automation of Electronic systems, vol. 7, No. 4, Oct. 2002, pp. 501-525.*

Cong, J and Ding, Y (1996). "Combinational logic synthesis for (LUT) based field programmable gate arrays," ACM Trans. Des. Autom. Electron. Syst. 1(2):145-204.

Cong, J. and Hwang, Y. (2001). "Boolean Matching for LUT-Based Logic Blocks With Applications to Architecture Evaluation and Technology Mapping," IEEE Transactions on Computer-Aided Design of Integrated Circuits and Systems, 20(9):1077-1090.

* cited by examiner

*Primary Examiner*—Thuan Do
(74) *Attorney, Agent, or Firm*—Townsend and Townsend and Crew LLP

(57) ABSTRACT

Techniques for mapping functions in a user design to lookup tables on a programmable integrated circuit are provided. Functions within a user design are rewritten as a composition of smaller, decomposed functions using a decomposition technique. An attempt is made to fit the decomposed functions into a lookup table configuration. If the decomposed functions do not fit into one the lookup table configurations for the programmable integrated circuit, the input variables are rotated within the user function. Then, an attempt is made to decompose the user function again based on the rotated input variables.

25 Claims, 4 Drawing Sheets

TECHNIQUES FOR MAPPING FUNCTIONS TO LOOKUP TABLES ON PROGRAMMABLE CIRCUITS

BACKGROUND OF THE INVENTION

The present invention relates to techniques for mapping functions to lookup tables on programmable circuits, and more particularly, to techniques for mapping functions to lookup tables that reduce the amount of circuitry needed to implement the functions.

A field programmable gate array (FPGA) is a programmable integrated circuit. Programmable integrated circuits also include programmable logic devices (PLDs), programmable logic arrays (PLAs), configurable logic arrays, etc. Many programmable integrated circuits are hybrids of FPGAs and ASICs (application specific integrated circuits).

FPGAs typically include programmable logic blocks, programmable routing resources, and programmable input/output (I/O) blocks. Each programmable logic block typically contain combinatorial components such as multiplexers and lookup tables as well as sequential components such as flip-flops.

Lookup tables are the basic logic blocks in many FPGAs today. A lookup table (LUT) includes memory cells that can store the truth tables of an arbitrary function. A LUT with k inputs can implement a function with k input variables. A LUT stores an output value corresponding to each set of input values. The pattern of output values describes the function.

A LUT receives a set of N digital input signals. The input signals are treated as a binary value with N bits. The binary value of the input signals are used as a memory address to access one of the LUT memory locations. A LUT outputs bits stored in the memory location. The memory location has an address corresponding to the binary value of the input signals.

A programmable integrated circuit is configured to implement a design provided by a user. Typically, the types of circuit elements in a user design do not correspond to the types of circuit elements in the FPGA, because users are not usually aware of the particular architecture of the FPGA. For example, the user typically does not implement the user design using LUTs.

Lookup tables and other circuit elements in the FPGA are selected to implement equivalent functions in the user design. This selection process involves synthesis and technology mapping. During synthesis, the user-made design is converted into a network of logic gates. During technology mapping, the logic gates are converted into logic blocks on the FPGA. Logic blocks are blocks on the FPGA that contain LUTs and registers.

Shannon expansion is a well known technique that maps a Boolean function to a set of lookup tables. However, as the number of input variables to the function increases, Shannon expansion maps the function to a disproportionately larger number of logic blocks.

For example, if each logic block on an FPGA has one 6-input LUT, Shannon expansion can be used to map a 7-input variable function to 3 logic blocks, a 10-input variable function to 21 logic blocks, and a 12-input variable function to 85 logic blocks.

Therefore, it would be desirable to reduce the number of lookup tables that are needed to implement functions on a programmable integrated circuit.

BRIEF SUMMARY OF THE INVENTION

The present invention provides techniques for mapping user functions in a user design to lookup tables on a programmable integrated circuit (IC). User functions within a user design are rewritten as a composition of smaller, decomposed functions using a decomposition technique. The decomposed functions typically have less input variables than the user function.

The present invention attempts to find decomposed functions that can fit into lookup table configurations available on the programmable IC. If such decomposed functions cannot be found, the input variables are rotated within the user function. The present invention then attempts to locate another set of decomposed functions that can fit into a lookup table configuration available on the programmable IC based on the rotated input variables.

Other objects, features, and advantages of the present invention will become apparent upon consideration of the following detailed description and the accompanying drawings, in which like reference designations represent like features throughout the figures.

DETAILED DESCRIPTION OF THE INVENTION

The present invention provides techniques for mapping functions in a user design to lookup tables (LUTs) on a programmable integrated circuit. A decomposition technique is used to rewrite a function within a user design as a composition of smaller functions that have less input variables. Decomposition functions are well known to those of skill in the art.

Many types of logic functions can be decomposed into smaller functions. However, some types of logic functions that can be mapped to LUTs using Shannon expansion cannot be mapped to LUTs using decomposition.

Let f(X) denote a logic function $f(x_1, x_2, x_3 \ldots, x_n)$, where $X=(x_1, x_2, \ldots x_n)$. If function f(X) can be represented by a function of $g(y_1(X_F), y_2(X_G), x_H)$, where $x_H$ belongs to X, then function f(X) can be decomposed into a composition of smaller functions. In decomposition function $g(y_1(X_F), y_2(X_G), x_H)$, $y_1$ and $y_2$ are performed by lookup tables F and G, respectively, and variable $x_H$ is an input to lookup table H. The configuration of lookup tables F, G, and H is illustrates in FIG. 1A.

Figure 1A:
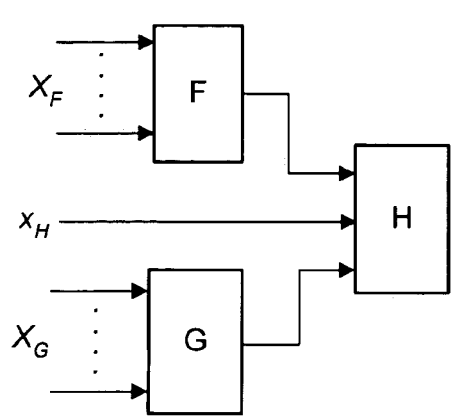
FIG. 1A illustrates an example of a programmable logic block architecture with three lookup tables.

Functions $y_1(X_F)$ and $y_2(X_G)$ are performed in a first stage of the decomposed function by LUTs F and G and function $g(y_1(X_F), y_2(X_G), x_H)$ is performed in a second stage of the decomposed function by LUT H as shown in FIG. 1A. The decomposition function is split into two stages, because the outputs of functions $y_1(X_F)$ and $y_2(X_G)$ must be generated first before function g is performed.

Functions $y_1(X_F)$ and $y_2(X_G)$ receive a first subset of input variables $x_1$–$x_n$. $X_F$ and $X_G$ are subsets of $x_1$–$x_n$. Function $g(y_1(X_F), y_2(X_G), x_H)$ receives the output signals of functions $y_1(X_F)$ and $y_2(X_G)$ and input variable $x_H$.

According to another embodiment, if function f(X) can be represented by a function of $g(y_1(B), y_2(B), \ldots y_t(B), x_{b+1}, \ldots, x_n)$, then function f(X) can be decomposed into a composition of smaller functions using a disjoint functional decomposition technique, where B is a bound set that equals $(x_1, x_2, \ldots, x_b)$, and B is a subset of X. This equation can also be expressed as $f(X)=g(Y(B), X-B)$. If t=1, it is called a simple disjoint decomposition. Functions $y_1(B), y_2(B), \ldots y_t(B)$ are performed in a first stage of the decomposed function, and function $g(y_1(B), y_2(B), \ldots y_t(B), x_{b+1}, \ldots, x_n)$ is performed in a second stage of the decomposed function.

Other types of decompositions are related to the disjoint decomposition. A non-disjoint decomposition of f(X) is the case when a bound set of variables appears in the support of function g. If $S=(x_j, \ldots, x_b)$ for some $j>1$, then a non-disjoint functional decomposition of f(X) is $g(Y(B), S, X-B)$. Variables in the set S are the non-disjoint variables. When S is an empty set, the decomposition becomes disjoint.

A partially dependent decomposition can be used when the support for some encoding function is a strict subset of B, for example, when $B_m=(x_1, \ldots, x_m)$ which is a subset of B. If the support of some partially dependent encoding function contains only one variable, this encoding function can be replaced by the variable, and the decomposition becomes a non-disjoint decomposition.

Figure 1B:
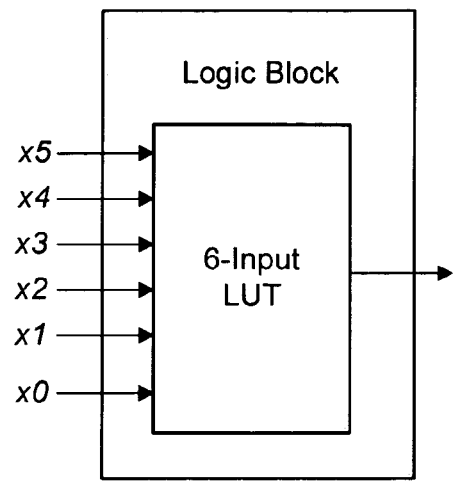
FIGS. 1B–1D illustrate examples of logic blocks that contain lookup tables on a programmable integrated circuit.
Figure 1C:
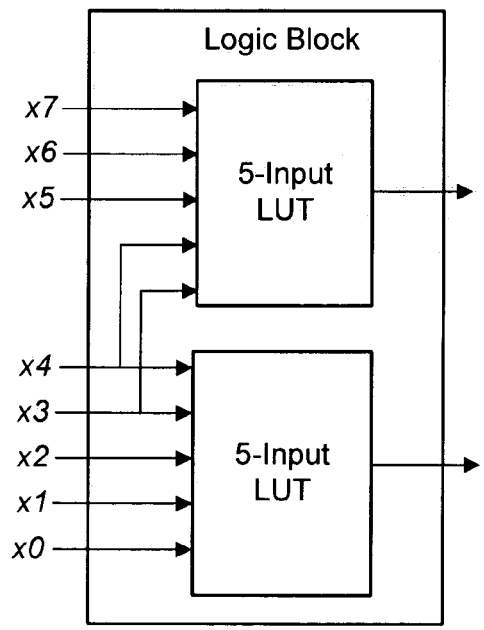
Figure 1D:
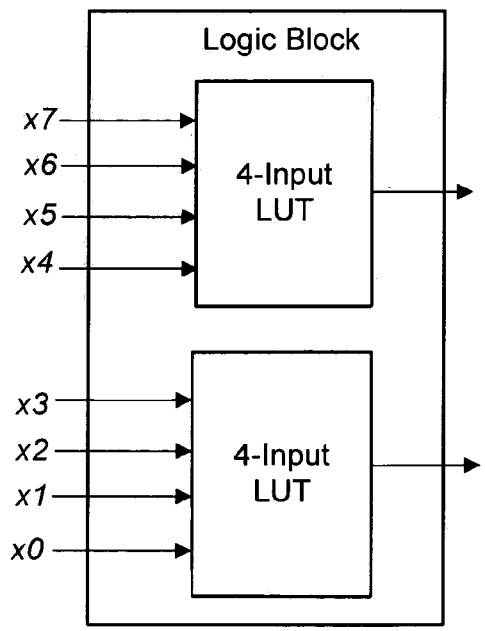

FIGS. 1B–1D illustrate examples of configurable logic blocks for a programmable integrated circuit. The logic blocks contain one or more LUTs and registers. The LUTs perform logic functions that are needed to implement a user design. FIG. 1B illustrates an example of a logic block that is configured to implement one six input LUT and generates one output signal.

FIG. 1C illustrates an example of a logic block that is configured to implement two five input LUTs. The first 5-input LUT receives input variables x0–x4 and the second 5-input LUT receives input variables x3–x7. Input variables x3–x4 are shared inputs between the LUTs. The logic block has no more than 8 unique input variables in all. The logic block generates two unique output signals, one from each LUT.

FIG. 1D illustrates an example of a logic block that is configured to implement two four input LUTs. The 2 LUTs receive 4 independent input variables, for a total of 8 unique inputs. The first 4-input LUT receives input variables x0–x3 and the second 4-input LUT receives x4–x7. Each 4-input LUT generates a unique output signal.

Figure 2A:
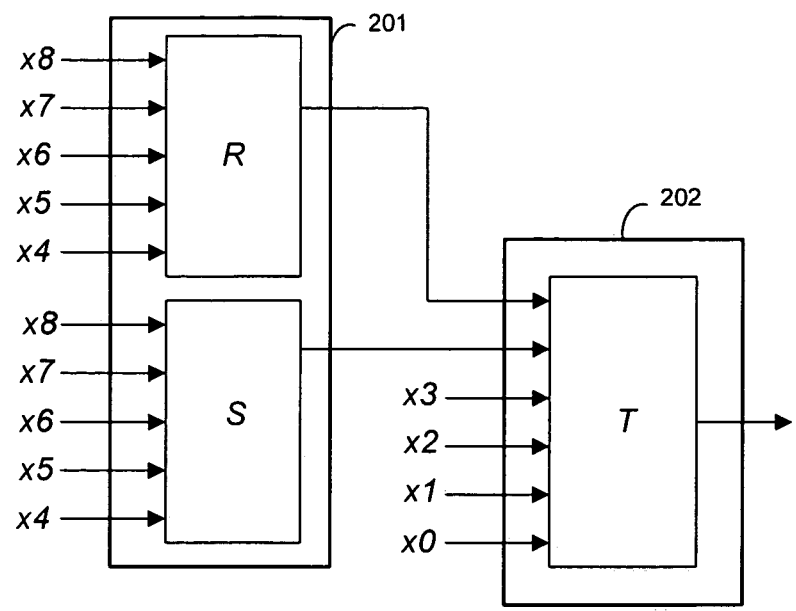
FIGS. 2A–2B illustrate a set of LUTs that perform a decomposed function in a user design for a programmable circuit according to embodiments of the present invention.
Figure 2B:
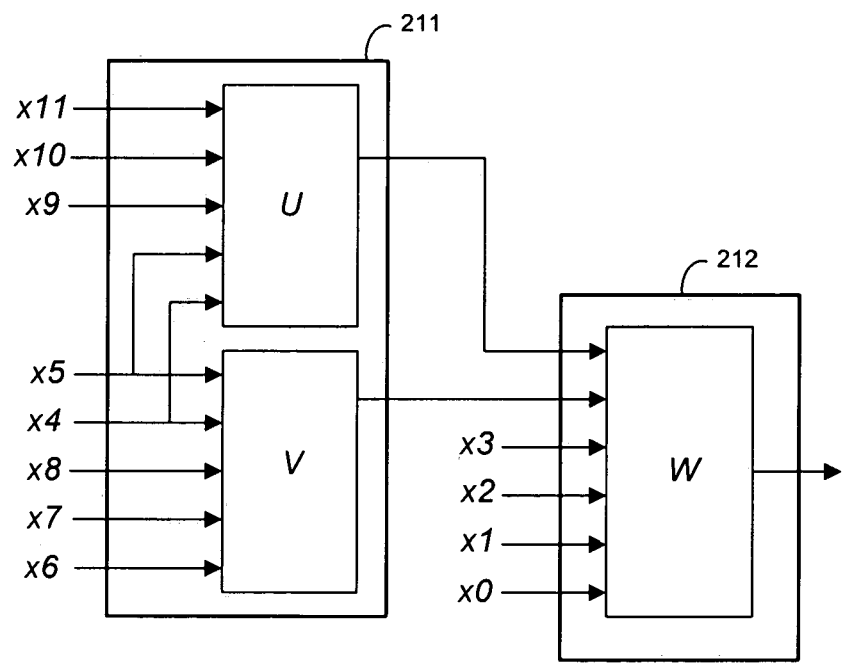
Figure 2C:
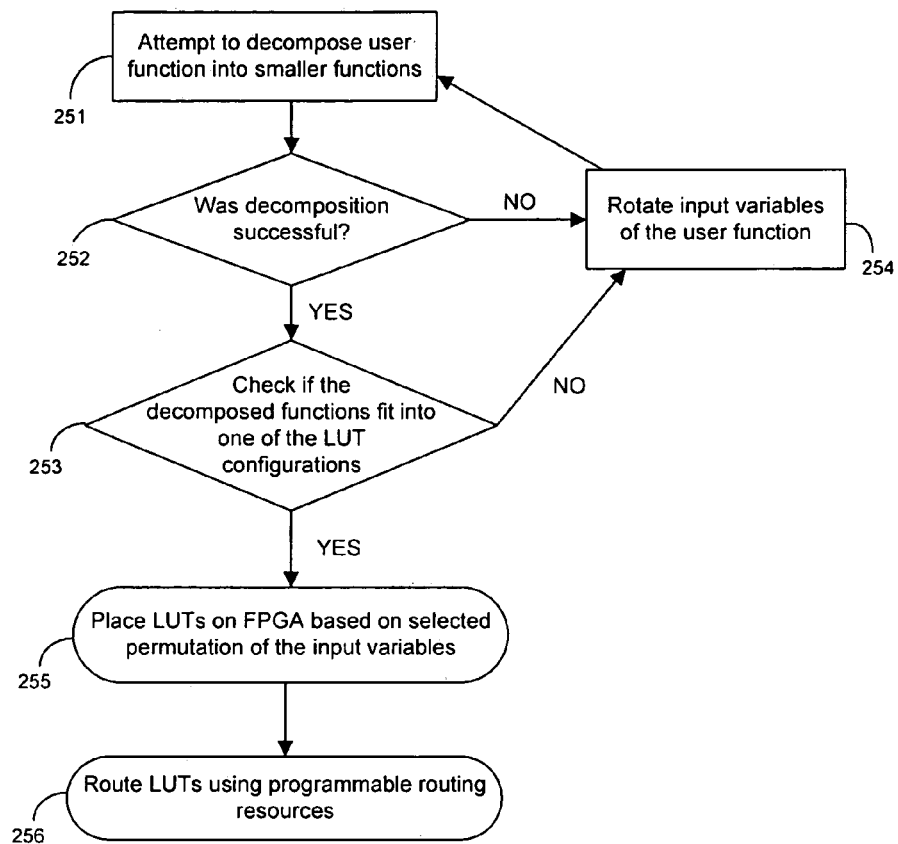
FIG. 2C is a flow chart that illustrates a process for mapping functions to lookup tables on programmable circuits according to an embodiment of the present invention.

FIGS. 2A–2C illustrates how a decomposed function can be mapped to a set LUTs according to an embodiment of the present invention. Many types of Boolean and logic functions can be decomposed, as discussed above.

For example, the non-disjoint decomposition of a 9-input function f(X) can be expressed as h(x0, x1, x2, x3, g1, g2), where g1 and g2 are functions of (x4, x5, x6, x7, x8). Functions g1 and g2 are first stage functions, and function h is the second stage function. The decomposition function h is dependent on 9 unique input variables x0–x8. A non-disjoint decomposition such as h can be mapped into a set of lookup tables (LUTs) according to the techniques of the present invention.

FIG. 2A illustrates an example of how a 9-input variable function such as f(X) can be mapped to only 3 LUTs. FIG. 2A illustrates a logic block 201 configured to implement two 5 input LUTs R and S and a logic block 202 configured to implement one 6-input LUT T. The LUTs of FIG. 2A can implement function f(X) by mapping the non-disjoint decomposition h(x0, x1, x2, x3, g1, g2) to LUTs R, S, and T.

Specifically, LUT R in FIG. 2A is programmed to perform function g1(x4, x5, x6, x7, x8). LUT S is configured to implement function g2(x4, x5, x6, x7, x8). Both 5-input LUTs R and S receive the same five input variables x4–x8. The 6-input LUT T is configured to implement non-disjoint decomposition function h(x0, x1, x2, x3, g1, g2). LUT T receives 4 unique input variables x0–x3 and the output signals from LUTs R and S.

By using the decomposition technique, only 2 logic blocks and three LUTs R, S, and T can implement function f(X), which has 9 unique input variables x0–x8. If Shannon expansion were used to map function f(X) to a set of LUTs, 13 logic blocks, each with a 6-input LUT, are needed to implement the function f(X).

FIG. 2B illustrates an example of how a 12-input function can be mapped to only 3 LUTs. For example, the non-disjoint decomposition of a 12-input function J(X) can be expressed as k(x0, x1, x2, x3, m1, m2), where m1 is a function of (x4, x5, x6, x7, x8), and m2 is a function of (x4, x5, x9, x10, x11). A non-disjoint decomposition such as k can be mapped into the set of lookup tables (LUTs) shown in FIG. 2B, according to an embodiment of the present invention.

In FIG. 2B, logic block 211 is configured to implement two 5 input LUTs U and V, and logic block 212 is configured to implement one 6-input LUT W. LUT U receives input variables x4, x5, x9, x10, and x11. LUT V receives input variables x4, x5, x6, x7, and x8. Input variables x4 and x5 are common inputs between LUTs U and V.

In the example of FIG. 2B, logic block 211 can only process a maximum of 8 unique input signals. Therefore, LUTs U and V share two of the same input variables x4 and x5. LUT U is programmed to implement the function m1. LUT V is programmed to implement the function m2.

Logic block 212 is configured to implement LUT W. LUT W is programmed to implement non-disjoint decomposition function k(x0, x1, x2, x3, m1, m2). LUT W receives input variables x0–x3 and the outputs of functions m1 and m2 from LUTs U and V.

By using the decomposition technique, only 2 logic blocks 211–212 and three LUTs U, V, and W can implement function J(X). If Shannon expansion were used to map function J(X) to a set of LUTs, 85 logic blocks, each with a 6-input LUT, are needed to implement the function J(X).

Thus, FIGS. 2A and 2B illustrate examples of how decomposition techniques can greatly reduce the number of LUTs and logic blocks that are required to implement functions in a user design for a programmable integrated circuit. The decomposition techniques save resources on the programmable integrated circuit and increase the speed and routability of user designs.

FIG. 2C is a flow chart that illustrates an example of how functions can be mapped to lookup tables on a programmable integrated circuit according to an embodiment of the present invention. The specific order of the steps in the process of FIG. 2C is shown as an example of the present invention and is not intended to limit the scope of the present invention.

During technology mapping, networks of logic gates in the user design are converted into logic blocks. The techniques of the present invention can modify the technology mapping process to increase logic efficiency and conserve resources on the programmable IC.

At step 251, a user function in a user design for a programmable integrated circuit (IC) is decomposed into a set of decomposed smaller functions using a decomposition technique, such as one of the decomposition techniques mentioned above. If the user function cannot successfully be decomposed into a set of smaller functions, then step 254 is implemented. Step 254 is discussed below.

If the user function can successfully be decomposed into a set of smaller functions, then step 253 is implemented. At step 253, a determination is made as to whether the decomposed smaller functions fit into one of the LUT configurations available in logic blocks on the programmable IC. In general, step 253 checks whether the decomposed smaller functions can fit into one of the LUT configurations allowed by a particular FPGA architecture.

For example, the logic block configuration of LUTs shown in FIGS. 2A–2B are examined to determine whether the decomposed functions fit into any of them. If the decomposed fit into one of the LUT configurations available on the FPGA, a set of logic blocks are selected, and LUTs in these logic blocks are configured to implement the decomposed functions.

The LUT configurations shown in FIGS. 1A–1D and 2A–2B are merely two examples of LUT configurations for a programmable IC. Programmable ICs can have many other types of LUT configurations, including LUTs that receive any suitable number of input variables.

If the decomposed functions do not fit one the LUTs configurations available in the FPGA architecture (step 253), the inputs variables of the user function are rotated at step 254. Rotating the input variables means that at least two of the input variables are rearranged.

Preferably, input variables are swapped between the first stage functions and the second stage function. For example, input variables x0–x11 of user function J(X) can be rotated by swapping at two or more of the input variables x0–x11 between the first stage functions and the second stage function. If the first stage functions accept input variables x4–x11 and the second stage function accepts input variables x0–x3, then any one or more of input variables x4–x11 can be swapped with input variables x0–x3.

Figure 2D:
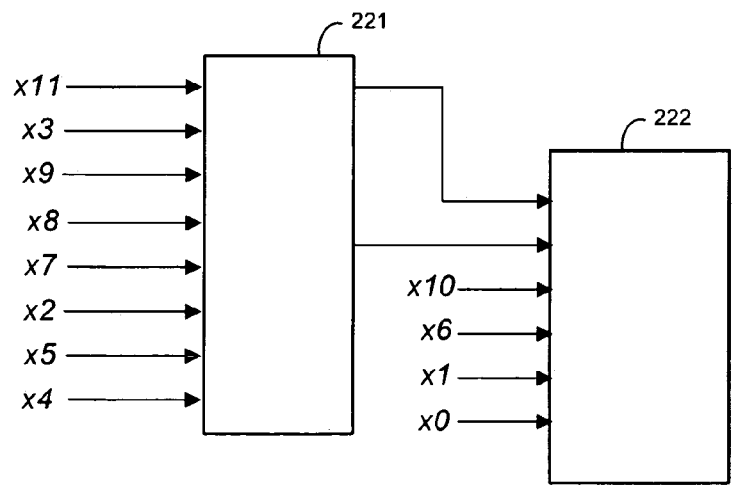
FIG. 2D illustrates how the input variables for the LUTs of FIG. 2B can be rotated according to an embodiment of the present invention.

FIG. 2D illustrates a specific example of how input variables can be rotated within a user function. Box 221 represents first stage 221 of a decomposed function, and box 222 represents second stage 222 of the decomposed function. During the first attempt at decomposition, variables x4–x11 are input into the first stage functions, and variables x0–x3 are input into the second stage function.

In FIG. 2D, input variables x3 and x10 have been swapped between first stage 221 and second stage 222, and input variables x2 and x6 have been swapped between stages 221 and 222. This is merely one example of the many possible rotations that can be performed on the input variables of a user function.

At step 251, an attempt is made to decompose the user function into another set of smaller functions based on the rotated input variables. In the example of FIG. 2D, an attempt is made to decompose user function J(X) into function r(s1, s2, x0, x1, x6, x10), where s1 and s2 are first stage decomposition functions that receive input variables x4, x5, x2, x7, x8, x9, x3, and x11. Function r is a second stage decomposed function that receives the outputs of functions s1 and s2 and input variables x0, x1, x6, and x10.

If the second decomposition is determined to be successful at step 252, step 253 is repeated to determine if the new set of decomposed functions can fit into one of the LUT configurations available on the programmable IC. If the decomposition is not successful at steps 252 or 253, the input variables of the user function are rotated again at step 254. Steps 251–254 are repeated until a LUT configuration is found that can implement the decomposed functions. Steps 251–254 can be repeated for other functions in the user design.

Once the user functions in the user design have been converted into LUTs on the programmable IC, the LUTs can be placed in logic blocks on the programmable integrated circuit at step 255 using well known placement techniques. The LUTs are then routed at step 256 by configuring programmable routing resources on the programmable integrated circuit using well known routing techniques.

In summary, the present invention provides techniques for mapping functions to lookup tables. The present invention attempts to decompose a user function in a user design for an FPGA into a set of decomposed functions using a decomposition technique. Decomposition greatly reduces the number of lookup tables that are needed to implement the function.

The present invention attempts to fit the decomposed functions into a LUT configuration on the FPGA. If the decomposed functions do not fit into one the LUT configurations on the FPGA, the input variables of the user function are rotated. The present invention then attempts to decompose the user function again based on the rotated input variables to locate a new set of decomposed functions that can fit into a LUT configuration. Many different Boolean and logic functions can be implemented by lookup tables using these techniques.

Figure 3:
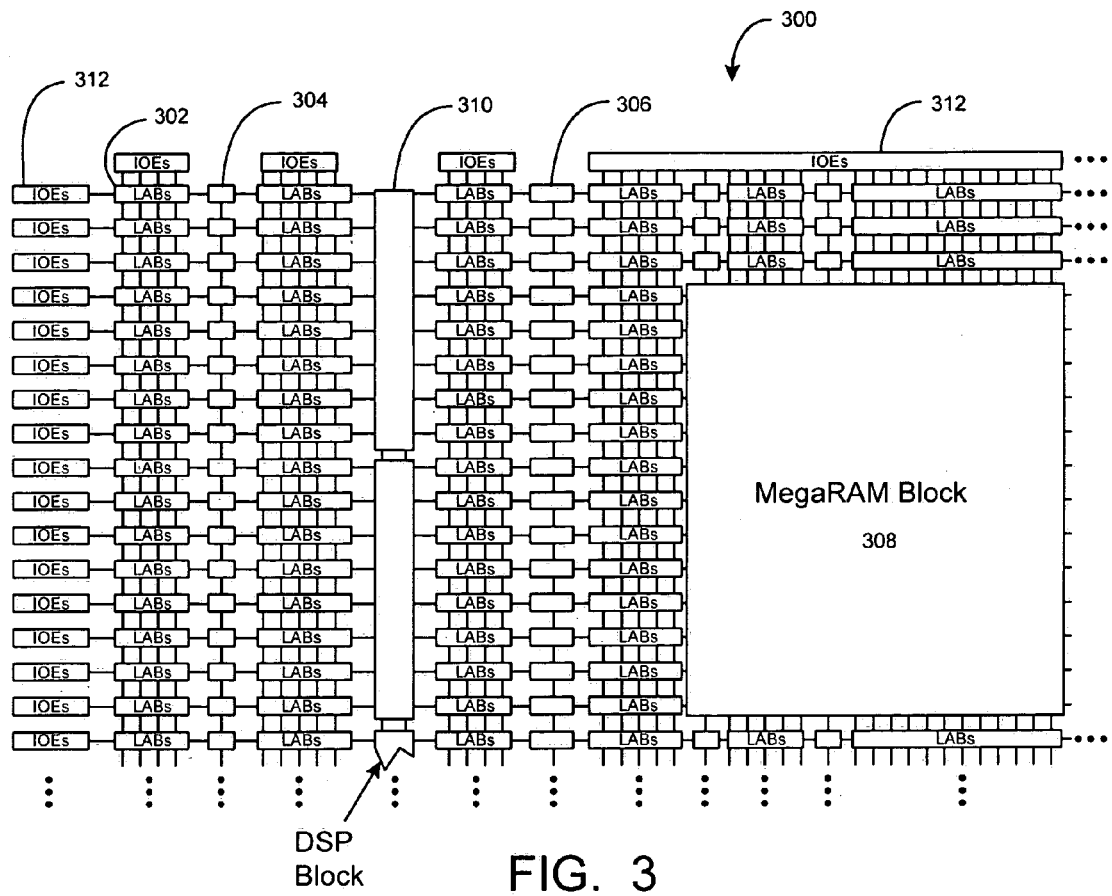
FIG. 3 is a simplified block diagram of a programmable logic device that can implement embodiments of the present invention.

FIG. 3 is a simplified partial block diagram of an exemplary high-density PLD 300 wherein techniques of the present invention can be utilized. PLD 300 includes a two-dimensional array of programmable logic array blocks (or LABs) 302 that are interconnected by a network of column and row interconnects of varying length and speed. LABs 302 include multiple (e.g., 10) logic elements (or LEs). A logic element is a type of logic block implements user defined logic functions.

PLD 300 also includes a distributed memory structure including RAM blocks of varying sizes provided throughout the array. The RAM blocks include, for example, 512 bit blocks 304, 4K blocks 306 and a MegaBlock 308 providing 512K bits of RAM. These memory blocks can also include shift registers and FIFO buffers. PLD 300 further includes digital signal processing (DSP) blocks 310 that can implement, for example, multipliers with add or subtract features. I/O elements (IOEs) 312 located, in this example, around the periphery of the device support numerous single-ended and differential I/O standards. It is to be understood that PLD 300 is described herein for illustrative purposes only and that the present invention can be implemented in many different types of PLDs, FPGAs, and the like.

Figure 4:
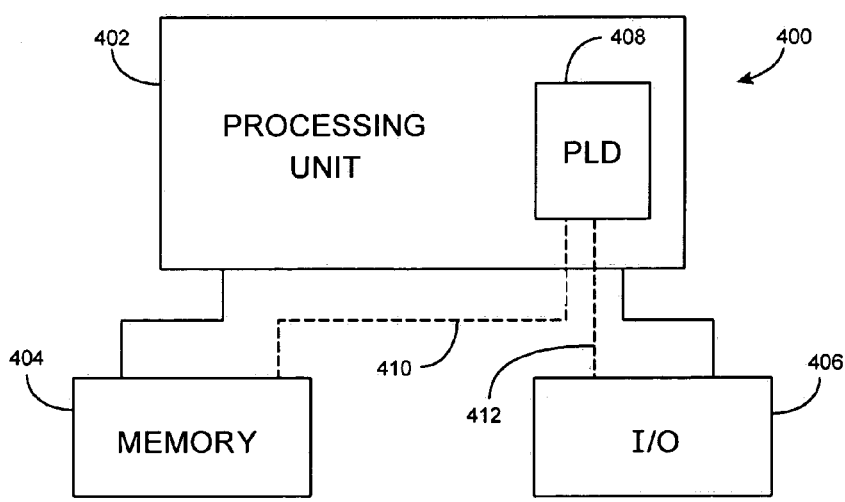
FIG. 4 is a block diagram of an electronic system that can implement embodiments of the present invention.

While PLDs of the type shown in FIG. 3 provide many of the resources required to implement system level solutions, the present invention can also benefit systems wherein a PLD is one of several components. FIG. 4 shows a block diagram of an exemplary digital system 400, within which the present invention can be embodied. System 400 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 400 can be provided on a single board, on multiple boards, or within multiple enclosures.

System 400 includes a processing unit 402, a memory unit 404 and an I/O unit 406 interconnected together by one or more buses. According to this exemplary embodiment, a programmable logic device (PLD) 408 is embedded in processing unit 402. PLD 408 can serve many different purposes within the system in FIG. 4. PLD 408 can, for example, be a logical building block of processing unit 402, supporting its internal and external operations. PLD 408 is programmed to implement the logical functions necessary to carry on its particular role in system operation. PLD 408 can be specially coupled to memory 404 through connection 410 and to I/O unit 406 through connection 412.

Processing unit 402 can direct data to an appropriate system component for processing or storage, execute a program stored in memory 404 or receive and transmit data via I/O unit 406, or other similar function. Processing unit 402 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 408 can control the logical operations of the system. In an embodiment, PLD 408 acts as a reconfigurable processor, which can be reprogrammed as needed to handle a particular computing task. Alternately, programmable logic device 408 can itself include an embedded microprocessor. Memory unit 404 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. A method for mapping a user function for a programmable integrated circuit to a plurality of lookup tables, the method comprising:
    providing a plurality of logic blocks, each configurable to operate as any one of the following:
        one N-input lookup table, wherein N is an integer; and
        at least two lookup tables, each having less than N inputs and an output;
    based on an amount of variables input to the user function, determining a set of available lookup table configurations that potentially implement the user function, wherein a lookup table configuration specifies the number of the lookup tables and the number of inputs for each logic block;
    decomposing the user function into a first set of decomposed functions, the user function receiving input variables;
    determining whether the first set of decomposed functions can be implemented by one of the set of lookup table configurations for the programmable integrated circuit; and
    if none of the set of lookup table configurations can implement the first set of decomposed functions, rotating at least two of the input variables of the user function.

2. The method according to claim 1 further comprising:
    decomposing the user function into a second set of decomposed functions; and
    determining whether the second set of decomposed functions can be implemented by one of the set of lookup table configurations for the programmable integrated circuit.

3. The method according to claim 1 further comprising:
    if the user function is not successfully decomposed into a set of decomposed functions, rotating at least two of the input variables of the user function; and
    attempting to decompose the user function into a second set of decomposed functions.

4. The method according to claim 1 further comprising:
    if one of the lookup table configurations can implement the first set of decomposed functions, placing lookup tables in the lookup table configuration into logic blocks on the programmable integrated circuit; and
    configuring programmable routing resources to connect the logic blocks on the programmable integrated circuit.

5. The method according to claim 4 wherein one of the lookup table configurations includes two 5-input lookup tables and one 6-input lookup table.

6. The method according to claim 4 wherein at least two of the input variables are shared between two of the lookup tables.

7. The method according to claim 4 wherein one of the lookup table configurations includes two 4-input lookup tables and one 6-input lookup table.

8. The method according to claim 1 wherein decomposing the user function into the first set of decomposed functions further comprises decomposing the user function into first stage functions and a second stage function,
    outputs of the first stage functions being inputs into the second stage function.

9. The method according to claim 8 wherein rotating at least two of the input variables of the user function further comprises swapping at least one of the input variables of the first stage functions with at least one of the input variables of the second stage function.

10. The method according to claim 9 further comprising:
    attempting to decompose the user function into a second set of decomposed functions based on the rotated input variables.

11. A computer program product stored on a computer readable medium for mapping a user function for a programmable integrated circuit to lookup tables, the computer program product comprising:
    code for providing a plurality of logic blocks, each configurable to operate as any one of the following:
        one N-input lookup table, wherein N is an integer; and at least two lookup tables, each having less than N inputs and an output;

code for determining a set of available lookup table configurations, based on an amount of variables input to the user function, that potentially implement the user function, wherein a lookup table configuration specifies the number of the lookup tables and the number of inputs for each logic block;

code for decomposing the user function into a first set of decomposed functions, wherein the user function receives input variables;

code for determining whether the first set of decomposed functions can be performed by one of the set of lookup table configurations on the programmable integrated circuit; and code for rotating at least two of the input variables of the user function if none of the configurations of lookup tables can implement the first set of decomposed functions.

12. The computer program product according to claim 11 further comprising:

code for rotating at least two of the input variables of the user function if the user function is not successfully decomposed into a set of decomposed functions; and code for attempting to decompose the user function into a second set of decomposed functions.

13. The computer program product according to claim 11 wherein the code for decomposing the user function into the first set of decomposed functions further comprises code for decomposing the user function into first stage functions and a second stage function, outputs of the first stage functions being inputs into the second stage function.

14. The computer program product according to claim 13 wherein the code for decomposing further comprises:

code for decomposing the user function into a second set of decomposed functions based on the rotated input variables, the second set of decomposed functions including first stage functions and a second stage function, wherein at least two input variables of the first and the second stages of the second set of decomposed functions have been rotated with respect to input variables of the first and the second stages of the first set of decomposed functions.

15. The computer program product according to claim 11 wherein the code for decomposing the user function into the first set of decomposed functions comprises code for decomposing the user function into the first set of decomposed functions using a non-disjoint decomposition technique.

16. The computer program product according to claim 11 wherein the code for decomposing the user function into the first set of decomposed functions comprises code for decomposing the user function into the first set of decomposed functions using a disjoint decomposition technique.

17. The computer program product according to claim 11 further comprising:

code for placing lookup tables in one of the lookup table configurations into logic blocks on the programmable integrated circuit, if that lookup table configurations can implement the decomposed functions; and code for configuring programmable routing resources to connect the logic blocks on the programmable integrated circuit.

18. The computer program product according to claim 11 wherein one of the lookup table configurations includes two 5-input lookup tables and one 6-input lookup table.

19. The computer program product according to claim 11 wherein one of the lookup table configurations includes two 4-input lookup tables and one 6-input lookup table.

20. The computer program product according to claim 11 further comprising:

code for decomposing the user function into a second set of decomposed functions based on the rotated input variables, if none of the configurations of lookup tables can implement the first set of decomposed functions; and code for determining whether the second set of decomposed functions can be implemented by one of the configurations of lookup tables for the programmable integrated circuit.

21. A method for mapping a user function to a programmable integrated circuit, the method comprising providing a plurality of logic blocks, each configurable to operate as any one of the following:
one N-input lookup table, wherein N is an integer; and
at least two lookup tables, each having less than N inputs and an output;

based on an amount of variables input to the user function, determining a plurality of available lookup table configurations that potentially implement the user function, wherein a lookup table configuration specifies the number of the lookup tables and the number of inputs for each logic block;

allocating the input variables of the user function to the inputs of the logic blocks of a first configuration; and determining whether the user function can be decomposed into a set of decomposed functions corresponding to the allocation of the input variables of the user function, each decomposed function having N or less input variable; and if the user function can not be decomposed into a set of decomposed functions according to the allocation of the input variables of the user function, swapping input variables between two of the lookup tables in the first configuration.

22. The method of claim 21, wherein the at least two lookup tables share inputs.

23. The method of claim 21, wherein a logic block configured to operate as at least two lookup tables receives more inputs than when the logic block operates as the one N-input lookup table.

24. The method of claim 21, further comprising:

continuing swapping at least two input variables of the user function between the inputs of at least two of the lookup tables in the first configuration until either a set of decomposed functions corresponding to a new permutation of the input variables of the user function is determined or until all of the permutations have been exhausted.

25. The method of claim 24, further comprising:

if a set of decomposed functions is not found for the first configuration, repeating allocating, determining, and swapping for additional configurations of the logic blocks that potentially implement the user function.

* * * * *